US012568627B2

(12) United States Patent
Nishikawa

(10) Patent No.: US 12,568,627 B2
(45) Date of Patent: Mar. 3, 2026

(54) THREE DIMENSIONAL SEMICONDUCTOR MEMORY DEVICE WITH A PLURALITY OF TUNNEL INSULATING LAYERS IN PROTRUDING PARTS

(71) Applicant: KIOXIA CORPORATION, Tokyo (JP)

(72) Inventor: Takuya Nishikawa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 835 days.

(21) Appl. No.: 17/883,464

(22) Filed: Aug. 8, 2022

(65) Prior Publication Data

US 2023/0301107 A1     Sep. 21, 2023

(30) Foreign Application Priority Data

Mar. 17, 2022     (JP) ................................. 2022-042716

(51) Int. Cl.
  *H10B 43/35*      (2023.01)
  *H10B 43/20*      (2023.01)
  *H10B 43/27*      (2023.01)
  *H10D 64/01*      (2025.01)

(52) U.S. Cl.
  CPC ............. *H10B 43/35* (2023.02); *H10B 43/20* (2023.02)

(58) Field of Classification Search
  CPC ........ H10B 43/35; H10B 43/20; H10B 43/27; H10D 64/037
  See application file for complete search history.

(56) References Cited

U.S. PATENT DOCUMENTS

| | | | |
|---|---|---|---|
| 10,700,078 B1 * | 6/2020 | Cui ......................... | H10B 41/27 |
| 2018/0040630 A1 * | 2/2018 | Kamigaichi ........... | H10B 43/35 |
| 2018/0277554 A1 * | 9/2018 | Kaneko ................... | H10B 41/27 |
| 2019/0273092 A1 * | 9/2019 | Sasaki ...................... | G11C 8/10 |
| 2020/0135759 A1 | 4/2020 | Choi et al. | |
| 2020/0168627 A1 | 5/2020 | Xiao et al. | |

* cited by examiner

*Primary Examiner* — Herve-Louis Y Assouman
(74) *Attorney, Agent, or Firm* — Kim & Stewart LLP

(57)     ABSTRACT

According to one embodiment, a semiconductor storage device includes a stacked body with conductive layers which are spaced apart one from another along a first direction. A pillar structure extends in the first direction through the conductive layers and has protruding parts, each of which protrudes outwardly from the pillar structure towards a conductive layer. The pillar structure includes a semiconductor layer, a tunnel insulating layers separately in each of the protruding parts between the semiconductor layer and the conductive layer. There is no tunnel insulating layer in the region between the adjacent protruding parts in the first direction. A charge storage layer is also separately in each protruding part between the tunnel insulating layer and the conductive layer.

10 Claims, 15 Drawing Sheets

15

12

14

12

14

12

14

12

23b
23a ] 23
24

25

Z
Y ⊗ → X

THREE DIMENSIONAL SEMICONDUCTOR MEMORY DEVICE WITH A PLURALITY OF TUNNEL INSULATING LAYERS IN PROTRUDING PARTS

CROSS-REFERENCE TO RELATED APPLICATION(S)

This application is based upon and claims the benefit of priority from Japanese Patent Application No. 2022-042716, filed Mar. 17, 2022, the entire contents of which are incorporated herein by reference.

FIELD

Embodiments described herein relate generally to a semiconductor storage device.

BACKGROUND

It is desirable to prevent charge transfer between adjacent memory cells in a three-dimensional NAND nonvolatile memory in which a plurality of memory cells are stacked on a semiconductor substrate.

DETAILED DESCRIPTION

In general, according to one embodiment, a semiconductor storage device includes a stacked body including a plurality of conductive layers which are stacked apart one from another along a first direction. A pillar structure is also in the storage device and extends in the first direction through the conductive layers. The pillar structure has a plurality of protruding parts, each of which protrudes outwardly from the pillar structure towards a corresponding one of the conductive layers in the stacked body. The pillar structure also includes a semiconductor layer that extends in the first direction, a plurality of tunnel insulating layers and a plurality of charge storage layers. Each of the plurality of tunnel insulating layers is in one of the protruding parts between the semiconductor layer and the corresponding one of the conductive layers. The tunnel insulating layers are not in a region between adjacent protruding parts in the first direction. Each tunnel insulating layer comprises a silicon oxynitride. Each of the plurality of charge storage layers is in one of the protruding parts between the tunnel insulating layer of the protruding part and the corresponding one of the conductive layers. The charge storage layers are not in the region between adjacent protruding parts.

Hereinafter, certain example embodiments will be described with reference to the drawings.

Figure 1:
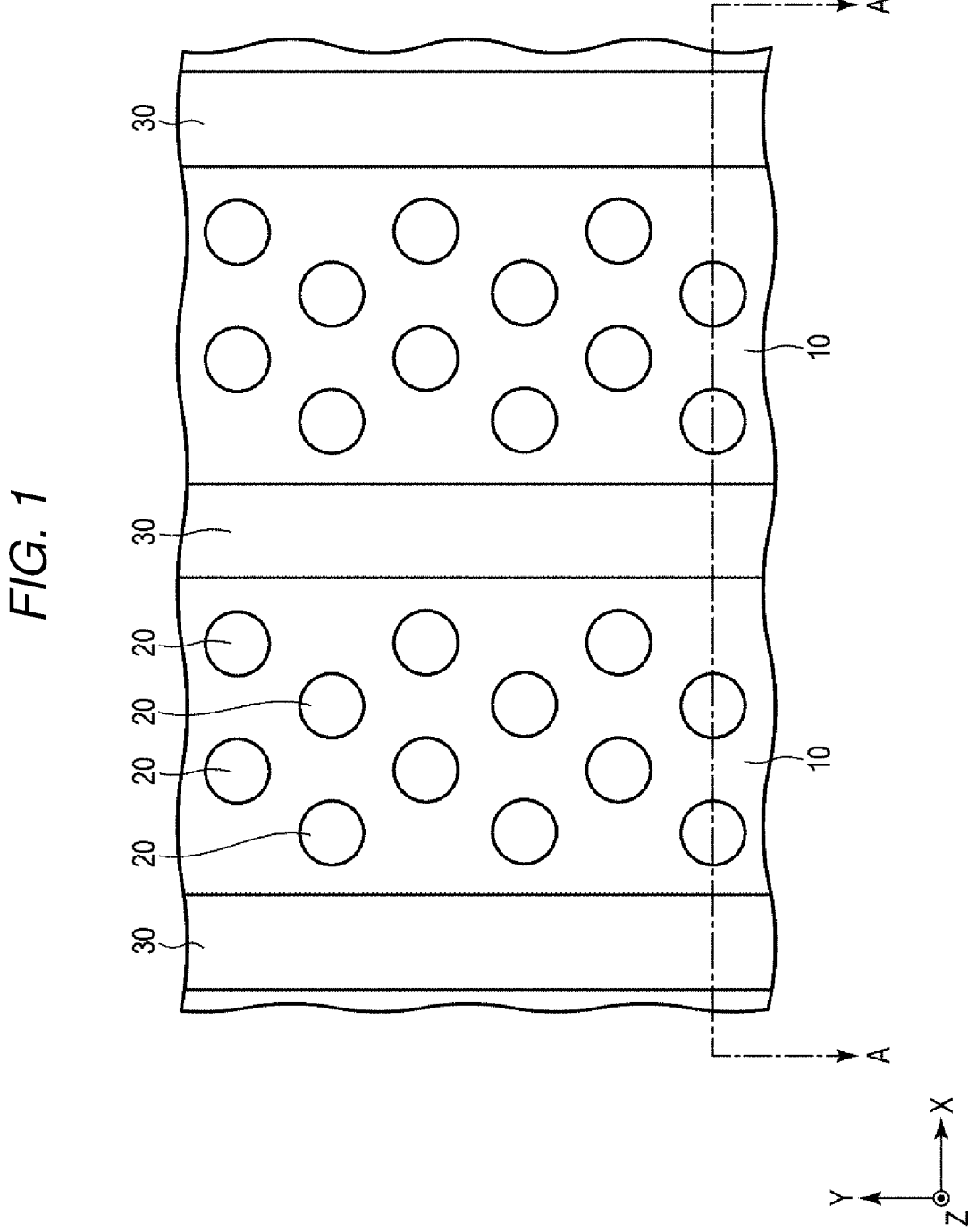
FIG. 1 is a schematic diagram illustrating a planar pattern of components of a semiconductor storage device according to an embodiment.
Figure 2:
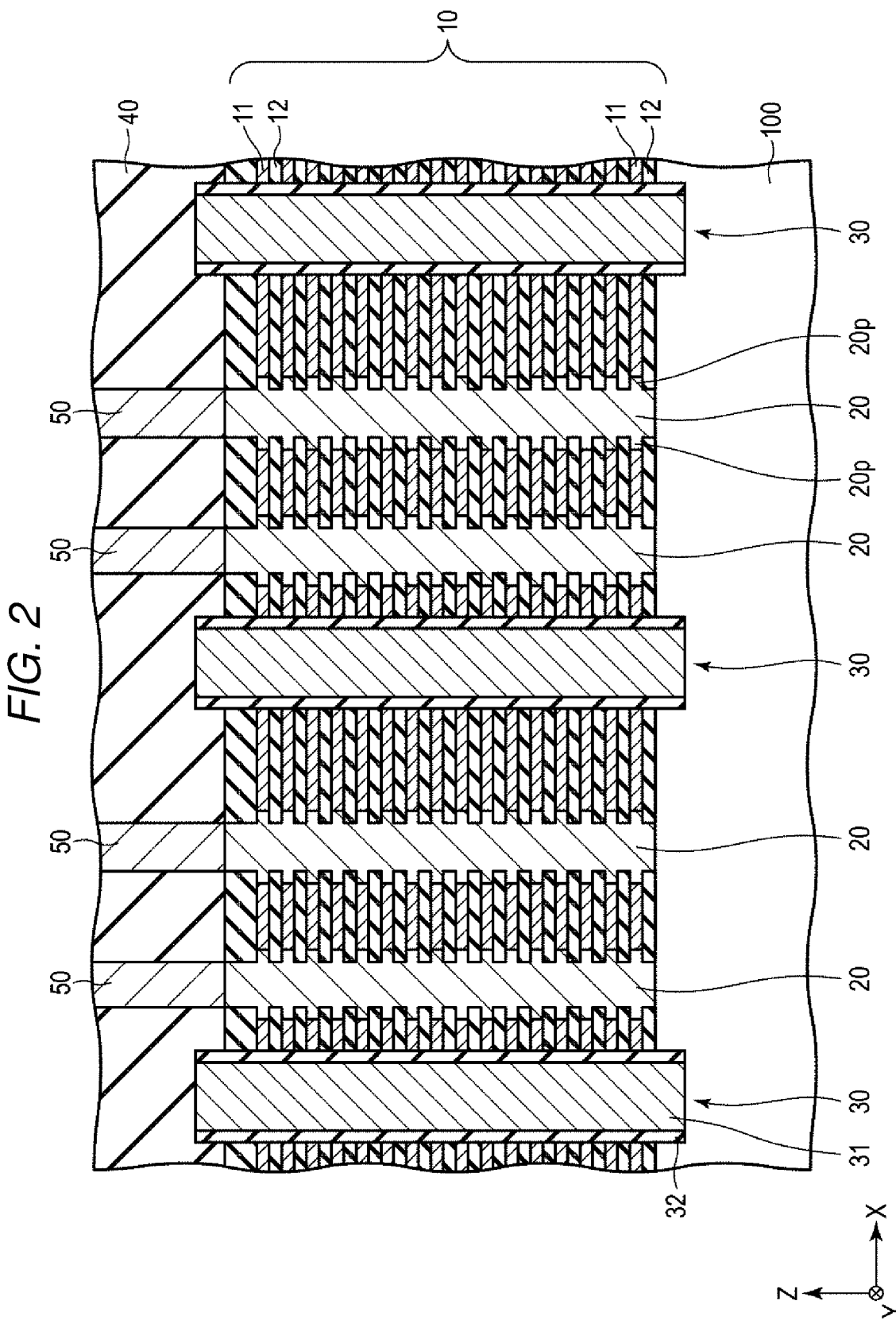
FIG. 2 is a schematic cross-sectional view illustrating of a semiconductor storage device according to an embodiment.

FIG. 1 is a schematic diagram illustrating a planar pattern of components of a semiconductor storage device according to an embodiment. In the present example, the semiconductor storage device is a NAND nonvolatile semiconductor storage device. FIG. 2 is a schematic cross-sectional view of the semiconductor storage device according to the embodiment. FIG. 2 is a cross-sectional view corresponding to a cross-section taken along line A-A of FIG. 1.

As illustrated in FIGS. 1 and 2, the semiconductor storage device according to the present embodiment includes a stacked body 10, a plurality of pillar structures 20, a plurality of partition structures 30, an interlayer insulating layer 40, and a plurality of contacts 50.

The stacked body 10 is provided on a semiconductor substrate 100. This stacked body 10 is a structure in which a plurality of conductive layers 11 and a plurality of insulating layers 12 are alternately stacked in the Z direction. That is, the plurality of conductive layers 11 are stacked to be apart from one another in the Z direction, and are electrically insulated by the insulating layers 12 therebetween.

The conductive layers 11 are formed from a conductive material, and the insulating layers 12 are formed from an insulating material, such as a silicon oxide. The conductive layers 11 and the insulating layers 12 are parallel to an XY plane perpendicular to the Z direction. The conductive layers 11 function as electrode layers. Specifically, each conductive layer 11 functions as either a word line or a select gate line.

The pillar structures 20 extend in the Z direction through the stacked body 10. Each pillar structure 20 includes a plurality of protruding parts 20p (see FIG. 4 for detail) that protrude outward toward the corresponding conductive layers 11.

The pillar structures 20 are surrounded by the conductive layers 11 and the insulating layers 12. A portion of each of the protruding parts 20p is surrounded by the conductive layer 11 in the XY plane. Each pillar structure 20 and the plurality of conductive layers 11 surrounding the pillar structure 20 form a NAND string that includes a plurality of memory cells connected in series with a plurality of select transistors provided on each end of the plurality of memory cells connected in series.

Specifically, each conductive layer 11 functions as a gate electrode. A portion of the conductive layer 11 and a portion of each pillar structure 20 surrounded by the conductive layer 11 form a memory cell or a select transistor. That is, the conductive layer 11 that functions as a word line and the corresponding portion of the pillar structure 20 surrounded by the conductive layer 11 functioning as the word line form a memory cell. Furthermore, the conductive layer 11 that functions as a select gate line and the corresponding portion of the pillar structure 20 surrounded by the conductive layer 11 functioning as the select gate line form a select transistor.

Each partition structure 30 extends in the Y and Z directions inside the stacked body 10. The partition structures 30 divide the stacked body 10 into a plurality of sub-parts in the X direction, and the pillar structures 20 are thus partitioned into a plurality of different groups along the X direction. Each of regions formed by the partition structures 30 is, for example, one memory block, which may be a minimum data erasure unit for example.

Each partition structure 30 is formed by filling a slit that was used in a layer replacement process (to be described later). The partition structure 30 is filled with material to form a conductive part 31 (formed from a conductive material) and an insulating part 32 (formed from an insulating material). The conductive part 31 has a lower end that is connected to, for example, a common source region of the semiconductor substrate 100, and functions as a source contact.

The stacked body 10, the pillar structures 20, and the partition structures 30 are covered with the interlayer insulating layer 40. The plurality of contacts 50 penetrate the interlayer insulating layer 40 and are connected to upper ends of the plurality of pillar structures 20.

Figure 3:
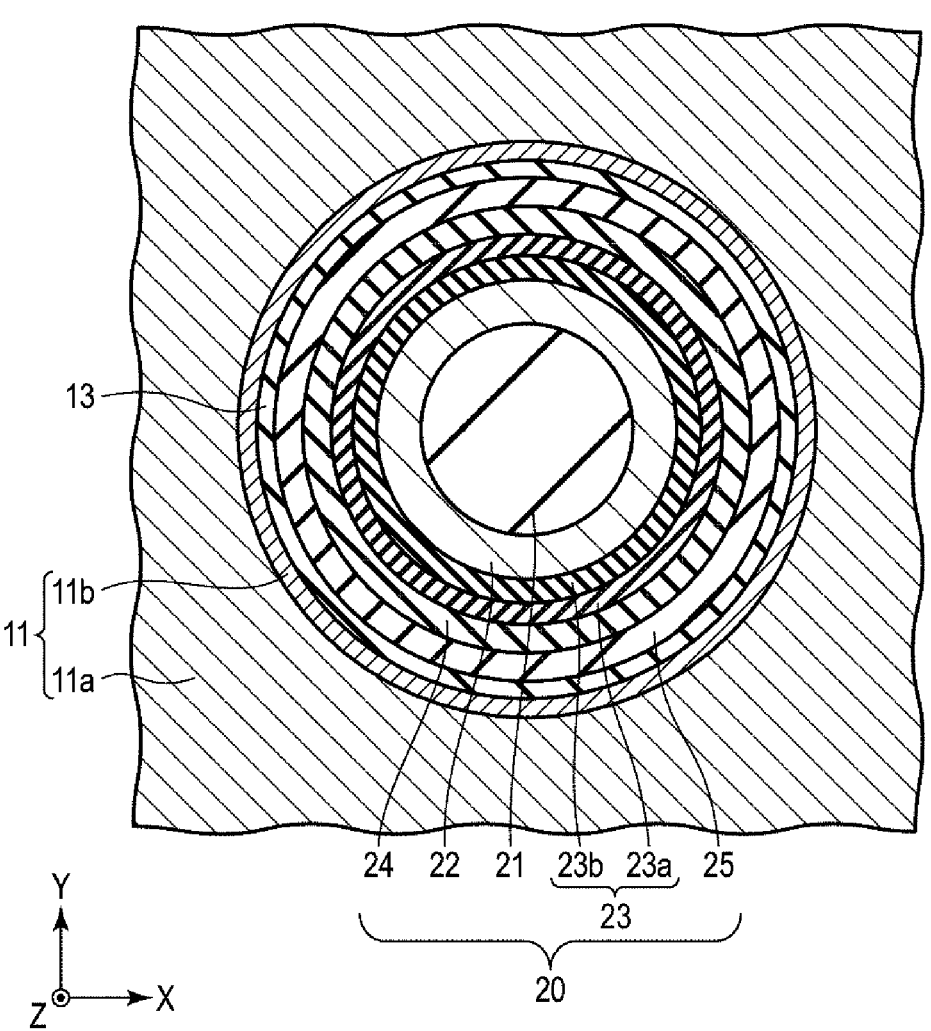
FIG. 3 is a schematic cross-sectional view of a pillar structure in a semiconductor storage device according to an embodiment.
Figure 4:
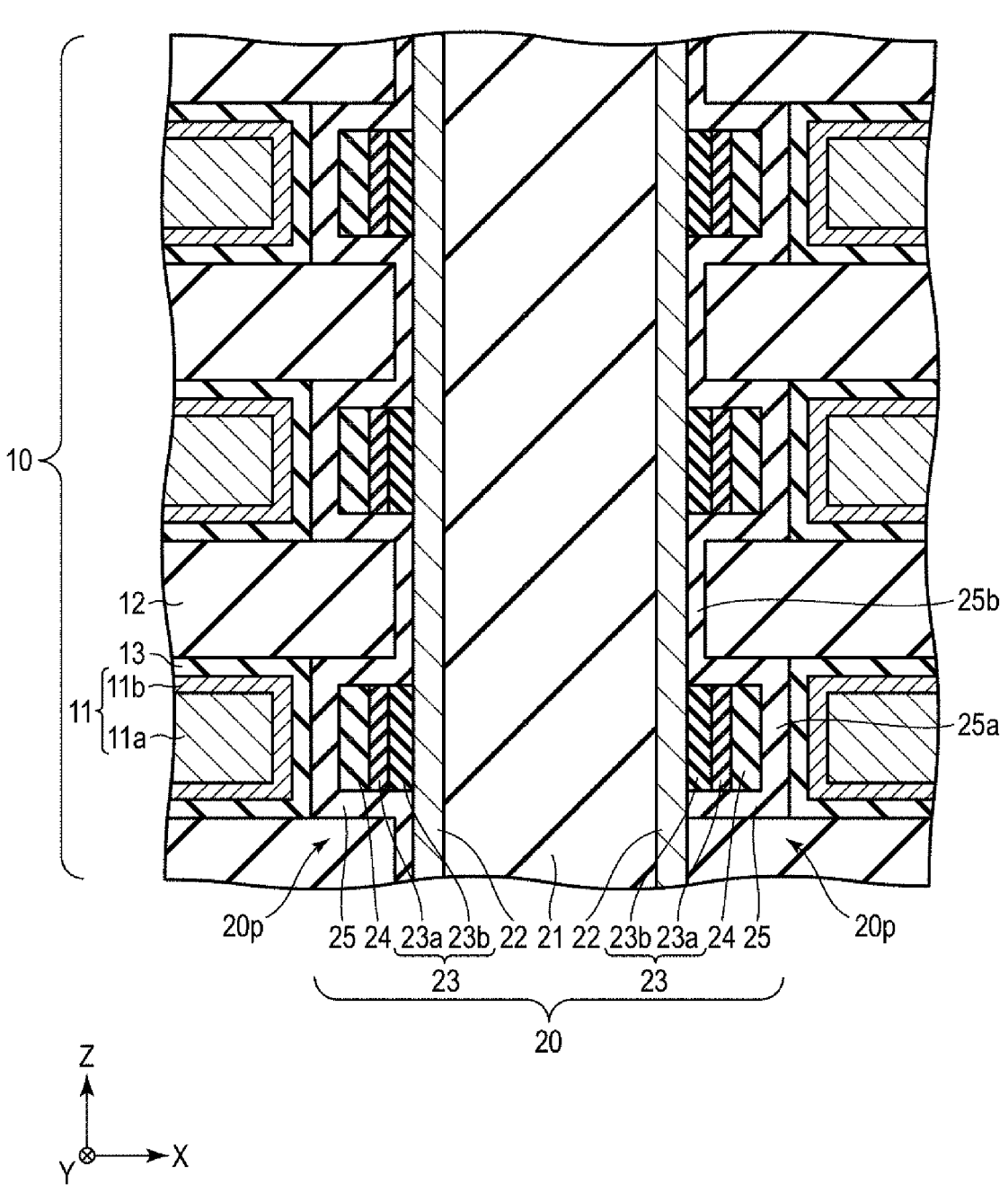
FIG. 4 is a schematic cross-sectional view of a pillar structure in a semiconductor storage device according to an embodiment.

FIGS. 3 and 4 are schematic cross-sectional views illustrating configurations of each pillar structure 20. FIG. 3 is the cross-sectional view in a direction perpendicular to the Z direction, and FIG. 4 is the cross-sectional view in a direction parallel to the Z direction.

Each pillar structure 20 includes a core insulating layer 21, a semiconductor layer 22, tunnel insulating layers 23, charge storage layers 24 (charge trap layers), and a block insulating layer 25.

As already described, each pillar structure 20 includes a plurality of protruding parts 20p at positions corresponding to the conductive layers. The protruding parts 20p protrude toward the corresponding conductive layers 11. That is, each protruding parts 20p protrudes in a direction parallel to the XY plane perpendicular to the Z direction. From another perspective, the stacked body 10 can be considered recessed in the direction parallel to the XY plane in positions corresponding to positions at which the conductive layers 11 are provided (in other words, side surfaces of the conductive layers 11 are recessed with respect to side surfaces of the insulating layers 12 in the direction parallel to the XY plane), and the protruding parts 20p are provided in these recessed portions.

The core insulating layer 21 is not disposed in any of the protruding parts 20p. The core insulating layer 21 has a columnar shape and extends substantially linearly in the Z direction. The core insulating layer 21 is formed from a silicon oxide ("SiO").

The semiconductor layer 22 is also not disposed in each protruding part 20p, but is opposed to each conductive layer 11 via a protruding part 20p therebetween. The semiconductor layer 22 has a cylindrical shape, surrounds side surfaces of the core insulating layer 21, and extends substantially linearly in the Z direction over a region opposed to each conductive layer 11 and a region between the protruding parts 20p adjacent in the Z direction. The semiconductor layer 22 is formed from silicon (Si). The semiconductor layer 22 forms a channel for the NAND strings along the Z direction, in which holes provided in the stacked body 10 for forming the pillar structures 20 each including the semiconductor layer 22 may have a taper shape or a bowing shape. Owing to this, when the entire semiconductor layer 22 extending in the stacked body 10 is viewed, the semiconductor layer 22 may be slightly inclined from the Z direction on the basis of the taper shape of the holes, or may have a nonlinear shape along the bowing shape of the holes.

Each of the tunnel insulating layers 23 is distributed along the Z direction of the semiconductor layer 22. Each tunnel insulating layer 23 is disposed in one of the protruding parts 20p. The tunnel insulating layer 23 is provided between the semiconductor layer 22 and the corresponding conductive layer 11, but is not provided in the region between the adjacent protruding parts 20p. That is, the tunnel insulating layer 23 is not provided between the semiconductor layer 22 and the insulating layers 12 in a direction parallel to the XY plane.

Each tunnel insulating layer 23 has a cylindrical shape and surrounds side surfaces of adjacent portions of the semiconductor layer 22. The tunnel insulating layer 23 includes a part 23a formed from a silicon oxynitride ("SiON") and a part 23b formed from a silicon oxide ("SiO"). The part 23a (formed from the silicon oxynitride) and the part 23b (formed from the silicon oxide) are provided between the semiconductor layer 22 and each charge storage layer 24. The part 23a is provided between the charge storage layer 24 and the part 23b.

Each of the charge storage layers 24 is disposed in a corresponding protruding part 20p. Each charge storage layer 24 is provided between a corresponding tunnel insulating layer 23 and conductive layer 11, but is not provided in the region between the adjacent protruding parts 20p. That is, the charge storage layer 24 is not provided between the semiconductor layer 22 and each insulating layer 12 in a direction parallel to the XY plane. The charge storage layer 24 has a cylindrical shape and surrounds side surfaces of the adjacent tunnel insulating layers 23. The charge storage layer 24 is formed from a silicon nitride ("SiN").

The block insulating layer 25 is comprised of a plurality of first parts 25a and a plurality of second parts 25b. Each of the first parts 25a is disposed in one of the protruding parts 20p and covers the outward facing surfaces of the tunnel insulating layer 23 and the charge storage layer 24 in the corresponding protruding part 20p. More specifically, the first part 25a covers upper and lower surfaces of the tunnel insulating layer 23 and the charge storage layer 24 as well as the surface of the charge storage layer 24 facing the conductive layer 11. Each of the second parts 25b is provided between adjacent first parts 25a and extends in the Z direction along the semiconductor layer 22 between protruding parts 20p. The block insulating layer 25 is formed from silicon oxide, for example.

Each conductive layer 11 is provided at a position corresponding to a protruding part 20p and includes a main conductive part 11a and a barrier metal part 11b. The main conductive part 11a is formed from tungsten (W) and the barrier metal part 11b is formed from titanium nitride ("TiN"), for example.

A block insulating layer 13 is provided outside of each conductive layer 11 along a surface of the conductive layer 11. The block insulating layer 13 is formed from an aluminum oxide ("AlO"), for example.

Each insulating layer 12 is provided at a position corresponding to a second part 25b of the block insulating layer 25, and is formed from silicon oxide, for example.

In the present embodiment, each pillar structure 20 includes the protruding parts 20p. The tunnel insulating layer 23 and the charge storage layer 24 are provided in each protruding part 20p. The tunnel insulating layer 23 and the charge storage layer 24 are not provided in the region between the adjacent protruding parts 20p. That is, in the present embodiment, a tunnel insulating layer 23 and a charge storage layer 24 are provided separately for each memory cell. The tunnel insulating layer 23 and the charge storage layer 24 are not provided in the region between the adjacent memory cells.

In the present embodiment, with the structures described above, it is possible to obtain a semiconductor storage device that can prevent or substantially limit charge transfer between adjacent memory cells and has high reliability.

The semiconductor storage device of the present embodiment stores data on the basis of charges being trapped (or not) in each charge storage layer 24 (charge trap layer). If the charge storage layer 24 were to be provided continuously in the region between the adjacent memory cells, there would be a concern with transfer of charges trapped in one charge storage layer to another charge storage layer of another one of the memory cells. When notionally trapped charges transfer between adjacent memory cells, incorrect data is possibly read from the memory cells. In the present embodiment, no charge storage layer 24 is provided in the region between the adjacent memory cells, so that it is possible to prevent the charge transfer between the adjacent memory cells and store data with high reliability.

In the present embodiment, each tunnel insulating layer 23 includes a part 23*a* (SiON) for providing an improvement in write characteristics and erasure characteristics. Relatively many traps are present in silicon oxynitride. Owing to this, if the tunnel insulating layer were to be provided continuously in the region between the adjacent memory cells, there would be a concern that charges might transfer between adjacent memory cells via the silicon oxynitride layer of the tunnel insulating layer and thus cause the reading of incorrect data from the memory cells. In the present embodiment, the tunnel insulating layer 23 is not provided in the region between the adjacent memory cells, so it is possible to prevent the charge transfer between the adjacent memory cells and store data with high reliability.

In the present embodiment, the first part 25*a* of the block insulating layer 25 is provided in each protruding part 20*p* and covers the outer facing surfaces of the tunnel insulating layer 23 and the charge storage layer 24 in the protruding part 20*p*. Owing to this, the first part 25*a* of the block insulating layer 25 can more surely prevent charge transfers between the adjacent memory cells. While the insulating layer 12 is provided in the region between the adjacent memory cells, the insulating layer 12 (e.g., a silicon oxide layer) is formed by CVD (chemical vapor deposition) in typically; therefore, it can be difficult to obtain a dense insulating layer 12. The block insulating layer 25 is a dense insulating layer formed at a high temperature and at a low pressure (LP). Therefore, it is possible to more effectively prevent the charge transfer between the adjacent memory cells and store data with high reliability.

Next, a method of manufacturing the semiconductor storage device according to the present embodiment will be described with reference to FIGS. 5A to 5I and FIG. 4.

Figure 5A:
FIGS. 5A to 5I are schematic cross-sectional views illustrating aspects of a method of manufacturing a semiconductor storage device according to an embodiment.
Figure 5A:
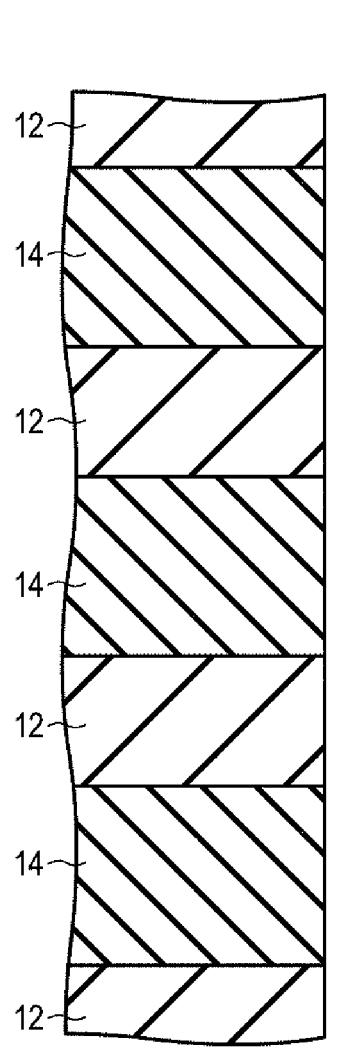
Figure 5A:
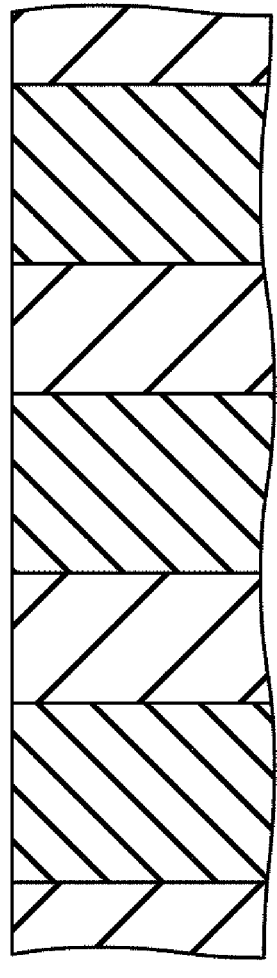
Figure 5A:
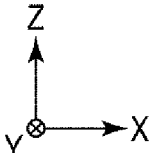

First, as illustrated in FIG. 5A, a preliminary stacked body in which the insulating layers 12 and sacrificial layers 14 are alternately stacked is formed, and a hole 15 penetrating this stacked body is then formed. The insulating layers 12 are silicon oxide and the sacrificial layers 14 are silicon nitride.

Figure 5B:
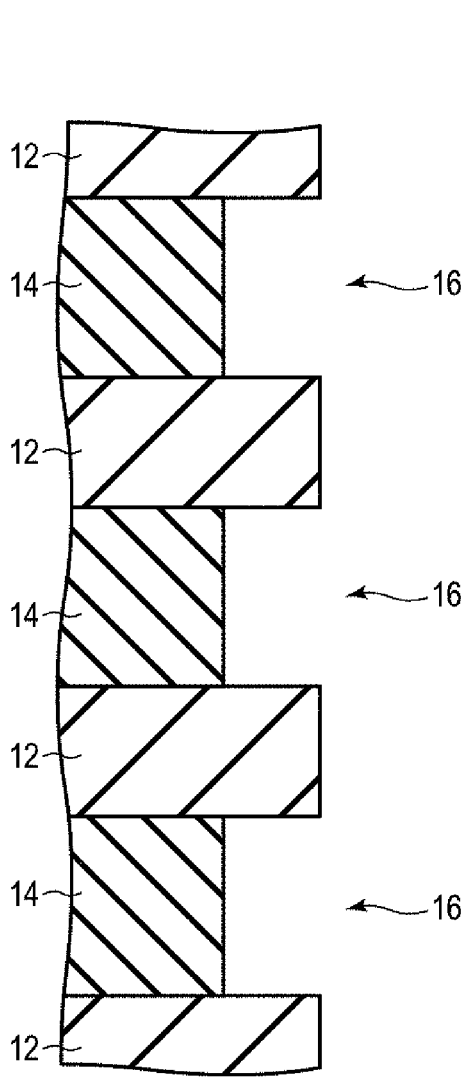
Figure 5B:
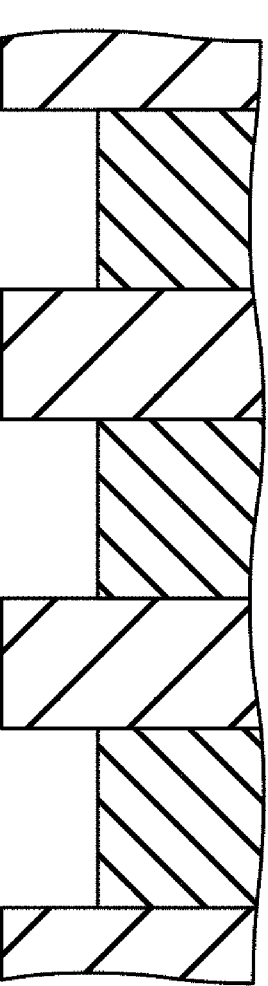
Figure 5B:
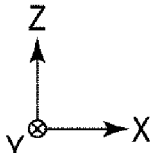

Next, as illustrated in FIG. 5B, recessed parts 16 are formed by recessing (removing) parts of the sacrificial layers 14.

Figure 5C:
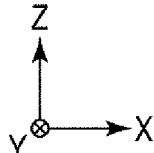

Next, as illustrated in FIG. 5C, a silicon oxide layer is formed as the block insulating layer 25 along an inner wall of the hole 15 (now including the recessed parts 16) at high temperature and at low pressure (LP).

Figure 5D:
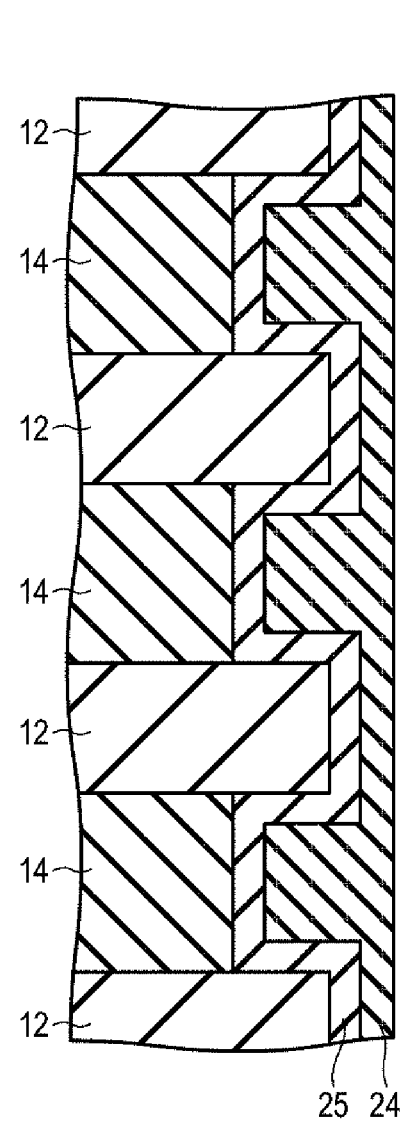
Figure 5D:
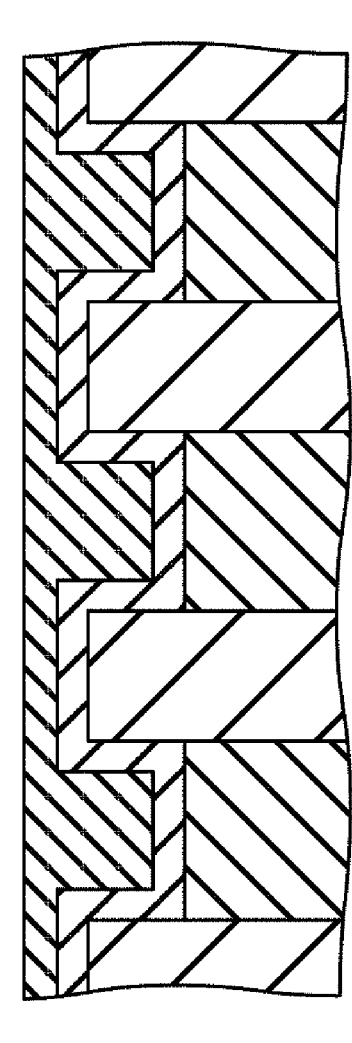
Figure 5D:
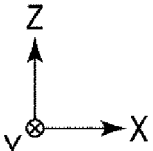

Next, as illustrated in FIG. 5D, a silicon nitride layer (for the charge storage layers 24) is formed on the inner wall of the hole 15 after the block insulating layer 25 is formed. At this time, this silicon nitride layer is formed so that the recessed parts 16 are completely filled with the silicon nitride layer.

Figure 5E:
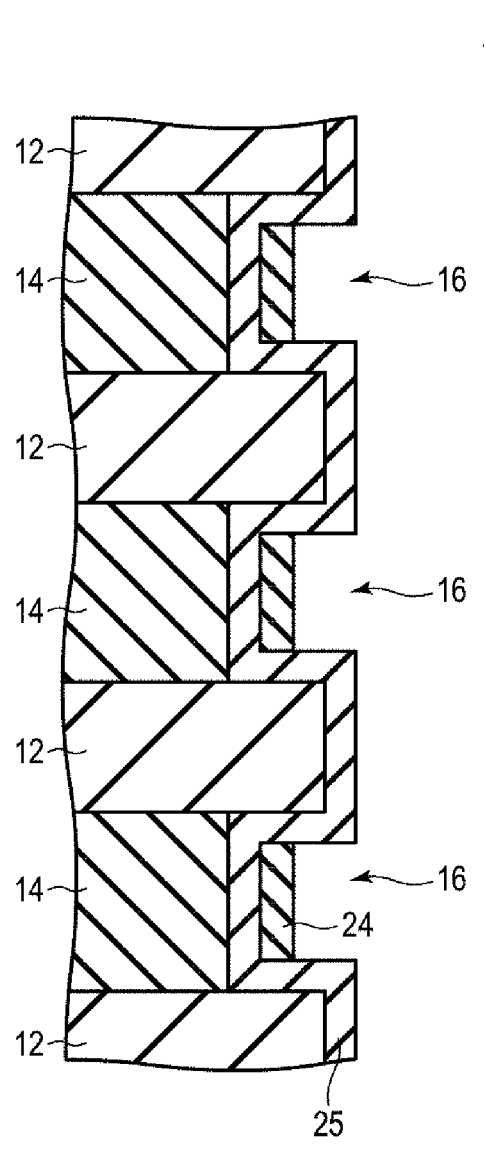
Figure 5E:
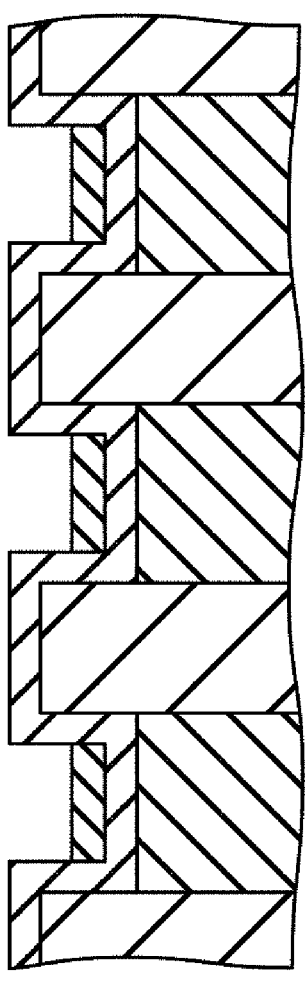
Figure 5E:
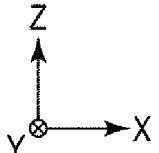

Next, as illustrated in FIG. 5E, the charge storage layers 24 are formed by removal of portions of the silicon nitride layer. The charge storage layers 14 are recessed into the recessed parts 16. Specifically, the charge storage layer 24 is etched with a phosphoric acid and the individual portions of the charge storage layers 24 are left in the recessed parts 16.

Figure 5F:
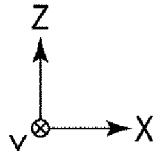

Next, as illustrated in FIG. 5F, a silicon oxynitride layer is formed as a preliminary tunnel insulating layer 23*x* on the inner wall of the hole 15 in which the charge storage layers 24 and the block insulating layer 25 have already been formed.

Figure 5G:
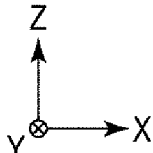

Next, as illustrated in FIG. 5G, portions of the preliminary tunnel insulating layer 23*x* is removed. An oxidation treatment is then performed. As a result, the tunnel insulating layers 23, which each include a part 23*a* formed of the silicon oxynitride and a part 23*b* formed of silicon oxide, are formed.

Figure 5H:
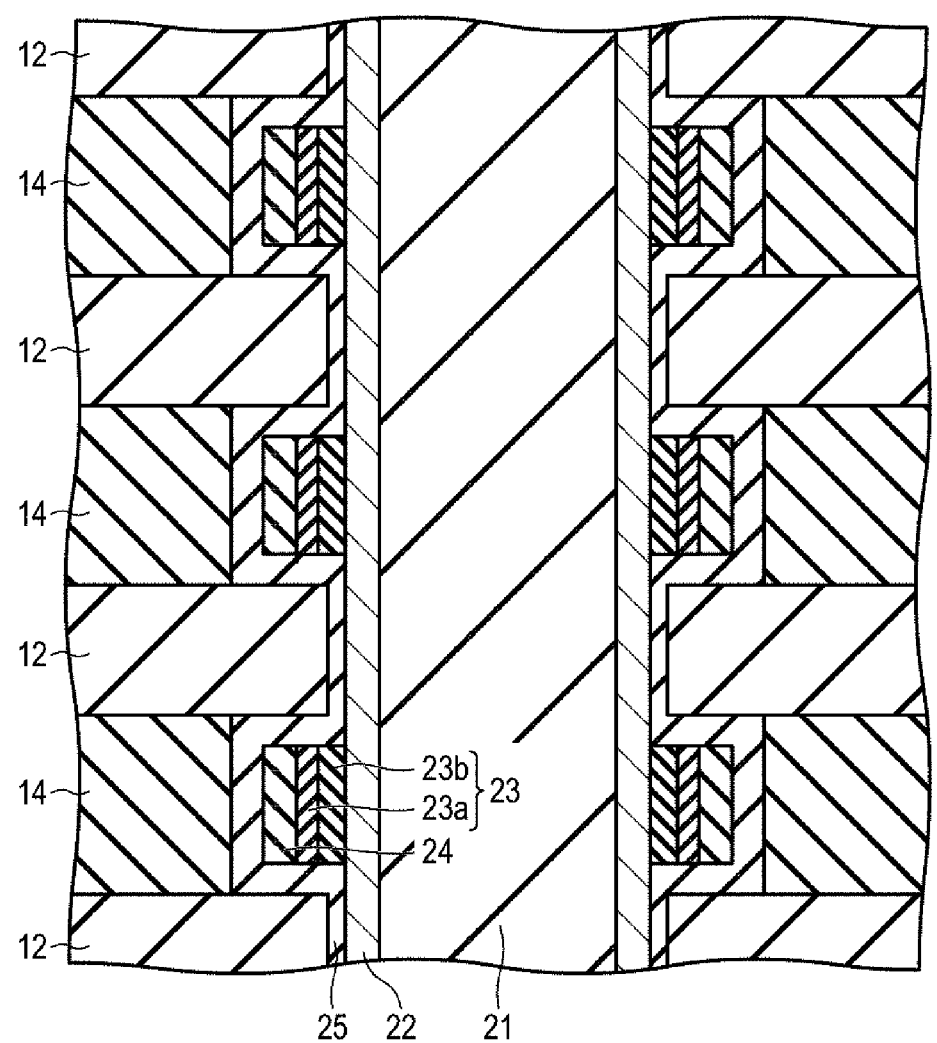
Figure 5H:
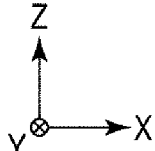

Next, as illustrated in FIG. 5H, a silicon layer is formed as the semiconductor layer 22 along the inner wall of the hole 15 obtained in a process of FIG. 5G. Furthermore, a silicon oxide layer is formed as the core insulating layer 21 in the hole 15 in which the semiconductor layer 22 has been formed.

Figure 5I:
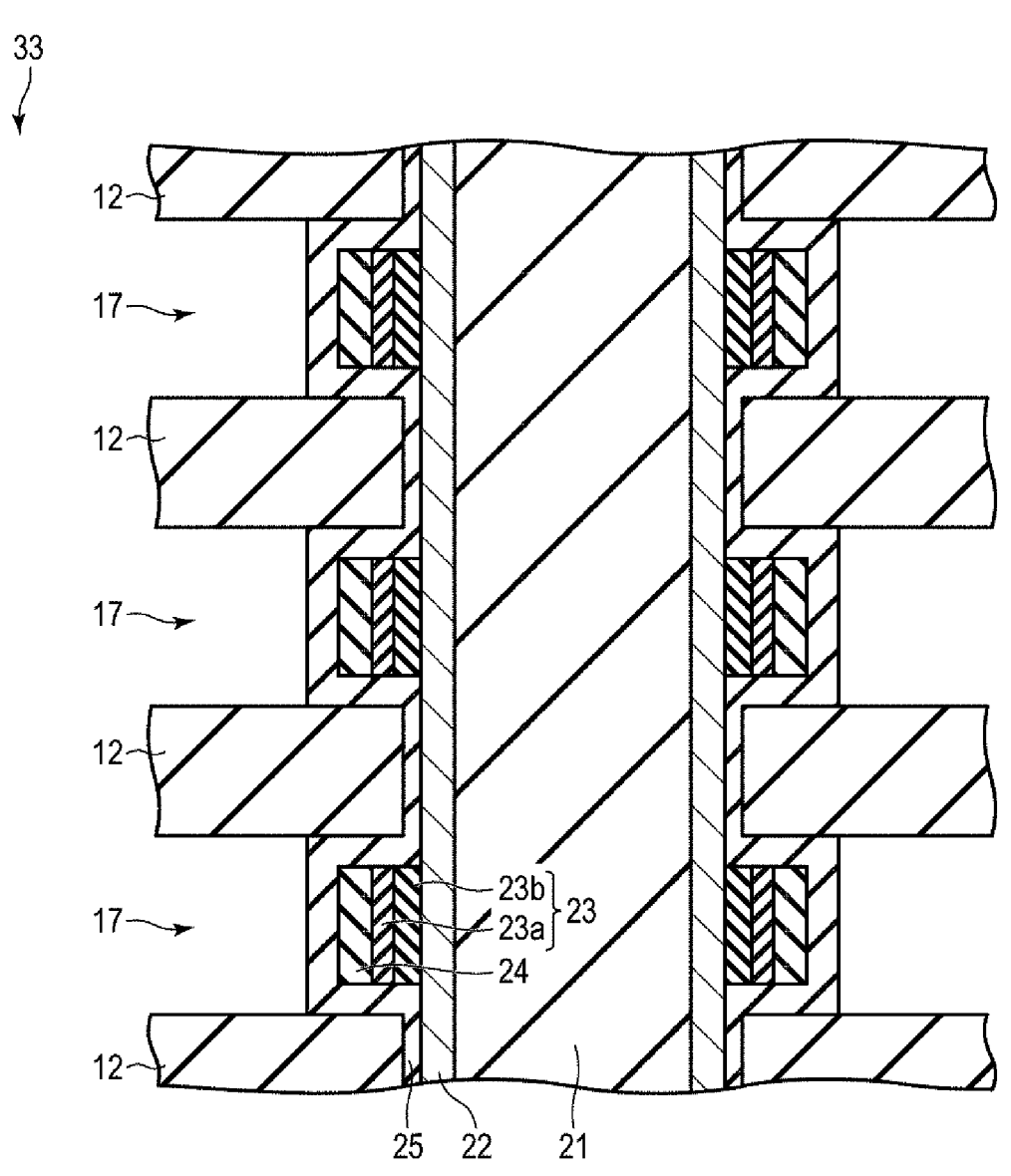
Figure 5I:
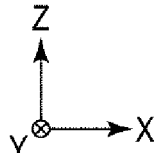

Next, as illustrated in FIG. 5I, the sacrificial layers 14 are removed to form cavities 17. Specifically, slits 33 extending in the Y direction and the Z direction are formed in the stacked body in which the insulating layers 12 and the sacrificial layers 14 are stacked, and the sacrificial layers 14 are etched via the slits 33, thereby forming the cavities 17.

Next, as illustrated in FIG. 4, an aluminum oxide layer that serves as the block insulating layer 13, a titanium nitride layer that serves as the barrier metal part 11*b* of each conductive layer 11, and a tungsten layer that serves as the main conductive part 11*a* of the conductive layer 11 are formed in the cavities 17 in sequence. In this way, the sacrificial layers 14 are replaced by the conductive layers 11.

Subsequently, the partition structures 30 are formed in the slits 33 formed for the processing of FIG. 5I, and then the interlayer insulating layer 40 and the contacts 50 are formed. The semiconductor storage device illustrated in FIGS. 1 and 2 is thereby obtained.

In this way, in the manufacturing method described above, forming the recessed parts 16 in the process of FIG. 5B makes it possible to form the protruding parts 20*p* of each pillar structure 20 in the recessed parts 16 and to effectively form the pillar structure 20 having the protruding parts 20*p*.

Figure 6:
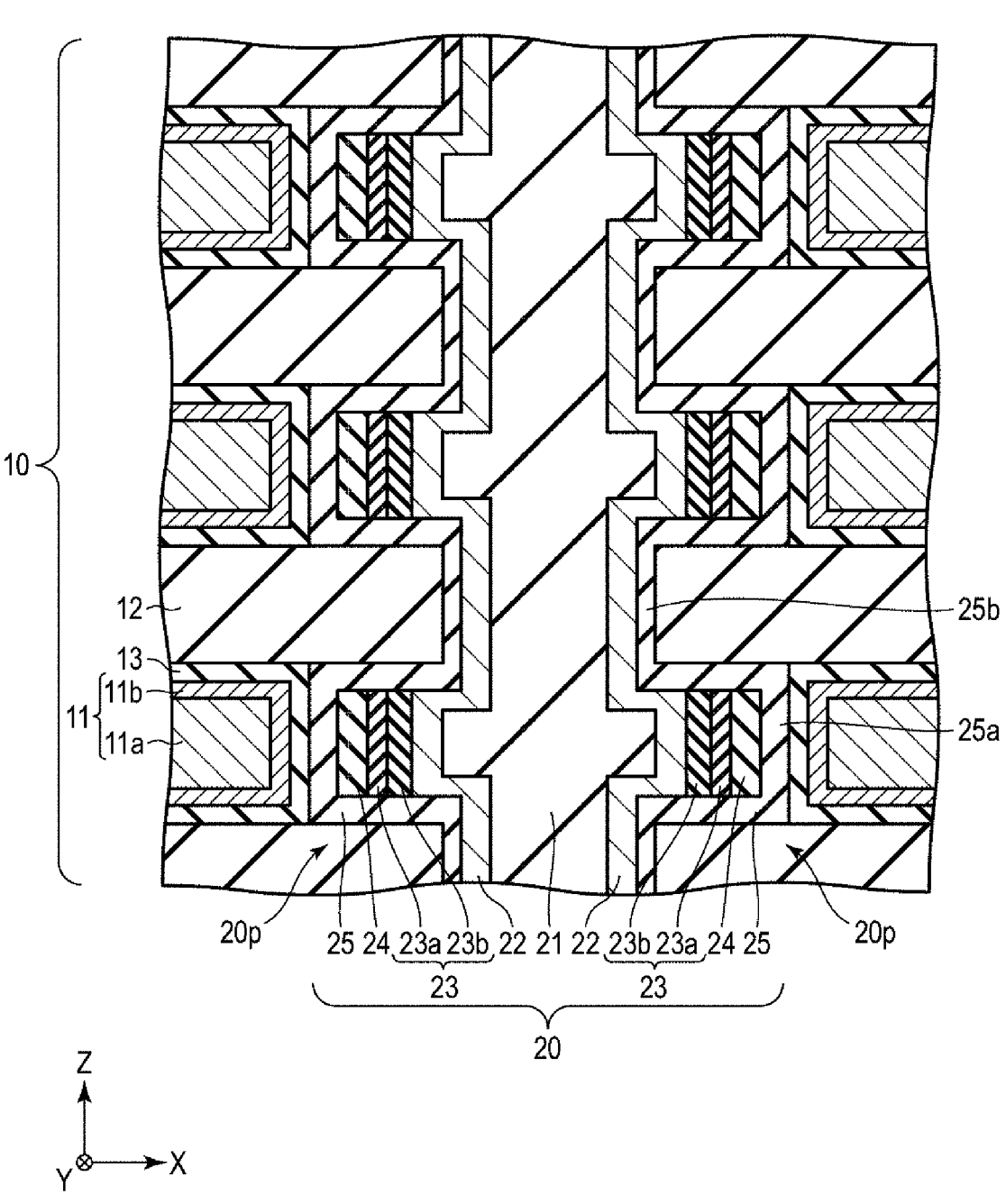
FIG. 6 is a schematic cross-sectional view of a semiconductor storage device according to a first modification of an embodiment.

Next, a first modification of the present embodiment will be described with reference to the cross-sectional view illustrated in FIG. 6.

In the embodiment described above, the semiconductor layer 22 extends substantially linearly along the Z direction over the region opposed to the conductive layers 11 and the regions between the adjacent protruding parts 20*p* in the Z direction, and the semiconductor layer 22 is not disposed in the protruding parts 20*p*. However, in the present modification, part of the semiconductor layer 22 is disposed in the protruding parts 20*p*. That is, in the present modification, the semiconductor layer 22 is bent toward the conductive layers 11 and the semiconductor layer 22 forms part of the protruding parts 20*p*.

The present modification is similar to the embodiment described above in basic configurations and can obtain similar effects to those of the embodiment described above.

Figure 7:
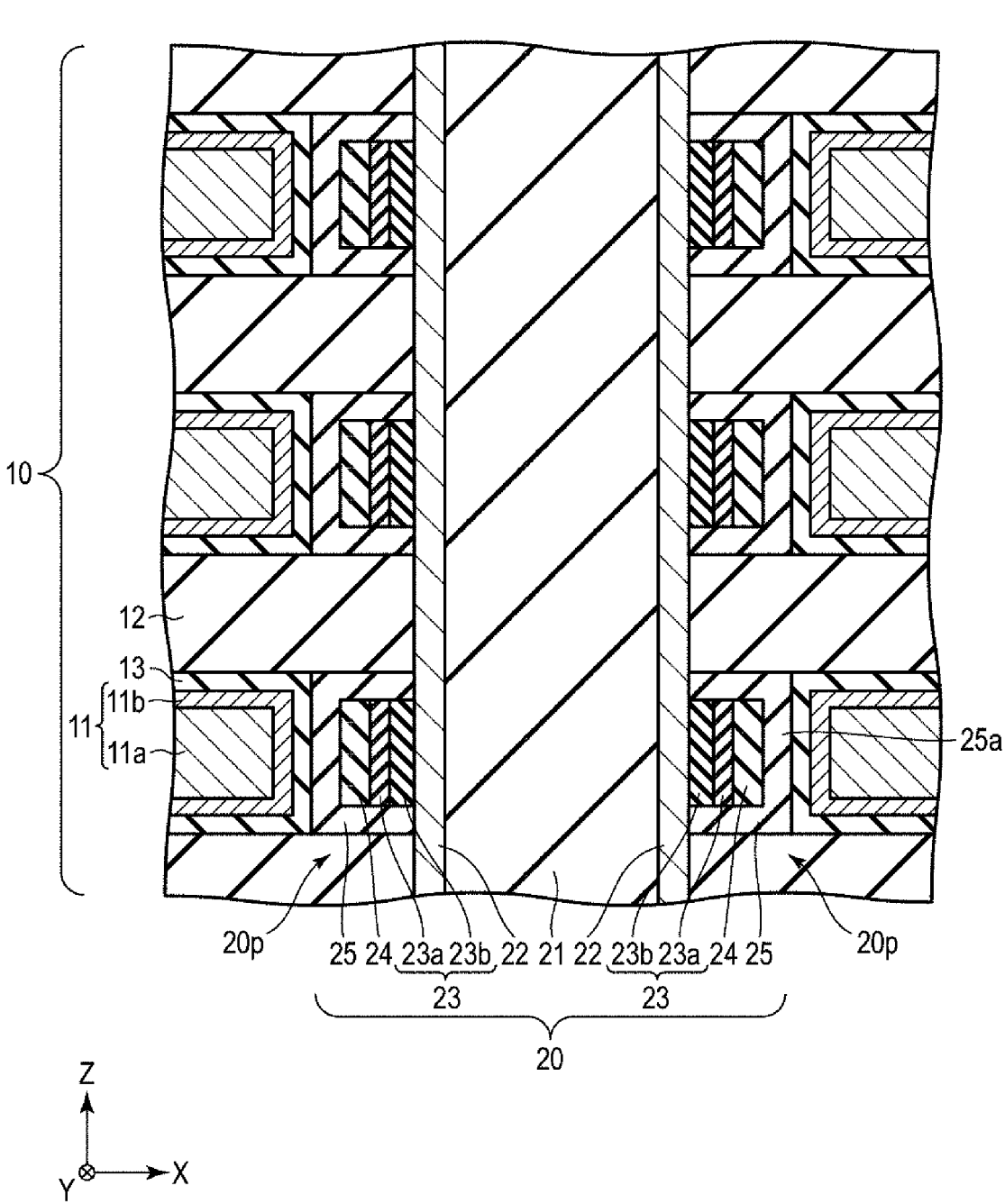
FIG. 7 is a schematic cross-sectional view of a semiconductor storage device according to a second modification of an embodiment.

Next, a second modification of the present embodiment will be described with reference to the cross-sectional view illustrated in FIG. 7.

In the embodiment described above, the block insulating layer 25 comprises first parts 25a and second parts 25b. In the present modification, the block insulating layer 25 includes only the first parts 25a and does not include the second parts 25b. That is, in the present modification, the block insulating layer 25 is not provided in the regions between the adjacent protruding parts 20p. That is, the block insulating layer 25 is provided in separate portions rather than as a continuous layer.

The present modification is similar to an example embodiment described above in basic configurations and can obtain similar effects to those of the example embodiment described above.

The charge trap-type semiconductor storage devices using the charge trap layers as the charge storage layers 24 are described in the example embodiments and modifications. Alternatively, a floating-gate-type semiconductor storage device using floating gates formed by the conductive layers as the charge storage layers 24 may be provided. Even a floating-gate-type semiconductor storage device arranged in a manner corresponding to the above examples can obtain similar effects to those already described.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a plurality of conductive layers stacked one on another in a first direction;
a pillar structure extending in the first direction through the plurality of conductive layers and including a plurality of protruding parts, each of which protrudes outwardly from the pillar structure towards a corresponding one of the conductive layers, wherein the pillar structure includes:
a semiconductor layer that extends in the first direction;
a plurality of tunnel insulating layers, each of which is in one of the protruding parts between the semiconductor layer and the corresponding one of the conductive layers, comprises silicon, oxygen, and nitrogen and is separated from tunnel insulating layers in adjacent protruding parts in the first direction; and
a plurality of charge storage layers, each of which is in one of the protruding parts between the tunnel insulating layer of the protruding part and the corresponding one of the conductive layers, and is separated from charge storage layers in adjacent protruding parts.

2. The semiconductor storage device according to claim 1, wherein the pillar structure further includes:
a block insulating layer including a plurality of first parts, each of which is in one of the protruding parts and covers outer surfaces of a structure including the tunnel insulating layer and the charge storage layer of the protruding part.

3. The semiconductor storage device according to claim 2, wherein the block insulating layer further includes a plurality of second parts, each of which is between adjacent first parts in the first direction and extends along the semiconductor layer in the first direction.

4. The semiconductor storage device according to claim 2, wherein the block insulating layer directly contacts the semiconductor layer.

5. The semiconductor storage device according to claim 1, wherein the semiconductor layer extends substantially linearly in the first direction from a region of the pillar structure facing one of the plurality of conductive layers to the region between adjacent protruding parts.

6. The semiconductor storage device according to claim 1, wherein part of the semiconductor layer is in each of the plurality of protruding parts.

7. The semiconductor storage device according to claim 1, wherein the plurality of charge storage layers are charge trap layers in the protruding parts.

8. The semiconductor storage device according to claim 2, wherein an interlayer insulating layer is between each adjacent pair of conductive layers in the plurality of conductive layers in the first direction.

9. The semiconductor storage device according to claim 8, wherein the block insulating layer is denser than the interlayer insulating layer.

10. The semiconductor storage device according to claim 8, further comprising:
a metal oxide layer between the block insulating layer and each conductive layer.

* * * * *